US006421823B1

(12) United States Patent
Heikes

(10) Patent No.: US 6,421,823 B1
(45) Date of Patent: Jul. 16, 2002

(54) BIDIRECTIONAL SOCKET STIMULUS INTERFACE FOR A LOGIC SIMULATOR

(75) Inventor: Craig Heikes, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 08/549,078

(22) Filed: Oct. 27, 1995

Related U.S. Application Data

(63) Continuation of application No. 08/173,730, filed on Dec. 22, 1993, now abandoned, which is a continuation of application No. 07/684,539, filed on Apr. 11, 1991, now abandoned.

(51) Int. Cl.[7] .............................................. G06F 15/00
(52) U.S. Cl. ......................................... 717/135; 712/37
(58) Field of Search ................................ 395/500, 800, 395/20, 919, 920; 364/578, DIG. 1, 57, 489, 148, 149, 151, 580; 371/23, 24, 27; 717/135; 712/37

(56) References Cited

U.S. PATENT DOCUMENTS

| | | | | |
|---|---|---|---|---|
| 4,306,286 A | * | 12/1981 | Cocke et al. | 364/DIG. 1 |
| 4,342,093 A | * | 7/1982 | Miyoshi | 364/578 |
| 4,527,249 A | * | 7/1985 | Van Brunt | 364/578 |
| 4,590,581 A | * | 5/1986 | Widdoes, Jr. | 364/578 |
| 4,601,032 A | * | 7/1986 | Robinson | 371/23 |
| 4,663,703 A | * | 5/1987 | Axelby et al. | 364/149 |
| 4,725,975 A | * | 2/1988 | Sasaki | 395/500 |
| 4,792,913 A | * | 12/1988 | Buckland et al. | 364/602 |
| 4,922,445 A | * | 5/1990 | Mizoue et al. | 364/578 |
| 5,051,938 A | * | 9/1991 | Hyduke | 364/578 |
| 5,105,374 A | * | 4/1992 | Yoshida | 364/578 |
| 5,126,966 A | * | 6/1992 | Hafeman et al. | 395/500 |
| 5,193,068 A | * | 3/1993 | Britman | 364/578 |
| 5,195,024 A | * | 3/1993 | Kurokawa et al. | 364/140 |
| 5,327,361 A | * | 7/1994 | Long et al. | 364/57 |
| 5,452,231 A | * | 9/1995 | Butts et al. | 364/489 |

FOREIGN PATENT DOCUMENTS

| | | |
|---|---|---|
| EP | 0 291 192 A2 | 11/1988 |
| EP | 0 406 756 A2 | 1/1991 |

OTHER PUBLICATIONS

M. Abramovici, et al., "System–Level Design Verification in the AT&T Computer Division: Overview and Strategy", Proceedings 1989 IEEE International Conference on Computer Design: VLSI in Computers & Processors, Oct. 2–4, 1989, pp. 542–547.

David Thomas, "RTL Simulation Makes a Comeback for Complex VLSI", Computer Design, vol. 25, No. 3, Feb. 1, 1986, pp. 63–67.

* cited by examiner

Primary Examiner—John A. Follansbee

(57) ABSTRACT

A communications socket between a logic simulator and a system for generating input stimuli based on the current state of the logic simulator is provided. Input stimuli to the logic simulator for use in implementing a particular circuit design simulation are calculated by interfacing an input program which models the function of the circuit being designed with the logic simulator. The lines in this input program are converted by an adaptive vector generator into communications signals which are understandable by the logic simulator so that the desired simulation may take place. The input program thus enables the adaptive vector generator to behaviorally model complex logical systems that the logic simulator model is only a part of and allows for more accurate and detailed simulation. The adaptive vector generator does this by determining the next input vector state in accordance with the present state of the logic simulator model as received from the communications socket. In other words, based on the state data received from the logic simulator, the adaptive vector generation automatically calculates the next stimulus pattern for the logic simulator model and provides this stimuli to the logic simulator through the communications socket. This technique removes the tediousness of the prior art techniques in that the design engineer no longer needs to specify every input step and to anticipate the output state of the circuit.

12 Claims, 5 Drawing Sheets

```
In    Reset 1
S
In    Reset 0
S
In    Clk 1
S
Out   A[3:0] = (0000)   (Test)
In    Clk 0
S
In    Clk 1
S
Out   A[3:0] = (0001)
In    Clk 0
S
In    Clk 1
S
Out   A[3:0] = (0010)
         .
         .
         .
```

FIG. 6(a)
PRIOR ART

```
              In    Reset 1
              S
              In    Reset 0
              S
              In    Clk 1
              S
              Out   A[3:0] = (0000)   (Test)
              In    Clk 0
              S
Line 10   3   Read  Node Data From Socket to X
          2   In    Clk 1
          1   S
          3   Out   A[3:0] = "X + 1"
          2   In    Clk 0
          1   S
          0   If    A[3:0] = (1111) THEN STOP,
                       ELSE LOOP TO Line 10
```

FIG. 6(b)

BIDIRECTIONAL SOCKET STIMULUS INTERFACE FOR A LOGIC SIMULATOR

This is a continuation of copending application Ser. No. 08/173,730 filed on Dec. 22, 1993, now abandoned which was a continuation of application Ser. No. 07/684,539 filed Apr. 11, 1991, now abandoned.

BACKGROUND OF THE INVENTION

1. Field of the Invention

The present invention relates to a bidirectional socket stimulus interface for a logic simulator, and more particularly, to a bidirectional socket stimulus interface which allows input stimuli to be provided interactively from a keyboard, from a data file, or from a UNIX® socket directly to the logic simulator. The system of the invention also allows the user to provide input stimuli which behaviorally model complex logic systems that the logic simulator model is part of by basing the state of the next input vector on the present state of the logic simulator.

2. Description of the Prior Art

When designing integrated circuits for performing particular functions, design engineers have traditionally drawn schematic diagrams of the proposed circuit setting forth all of the elements and interconnections necessary for the circuit to perform the desired functions. From the schematic diagrams, prototype circuits were built and tested. Before the advent of computer aided design (CAD) systems, the prototype of the circuit was actually built using techniques such as wire-wrapping and the like. The resulting prototype circuit was then tested by applying different combinations of input signals (input vectors) to the circuit and checking the output of the circuit on a device such as an oscilloscope. Errors in the circuit design were found when the outputs were not those desired, and the design flaw or improper connection was typically manually tracked down by careful examination of the circuit schematic and prototype wiring. Once the design flaw or improper connection was found, the prototype circuit was rebuilt and retested. This circuit design process was very time-consuming and tedious, and accordingly, design engineers sought different methods for converting the circuit schematic into a circuit which performs the desired functions.

Computer aided design (CAD) systems have greatly helped design engineers in this circuit design process. CAD systems allow the design engineer to prepare the circuit schematics on the computer, to lay out the circuit for implementation on a circuit board, and to test the circuit using logic simulation techniques. Logic simulators thus allow the design engineer to test the proposed circuit design without actually building the prototype. This is accomplished by having the design engineer specify as input to the logic simulator the elements and nodes of the circuit and the signals expected at those nodes for particular inputs. This information is determined directly from the circuit schematic diagram and is typically input into the logic simulator as an input file. The logic simulator runs this data through a model of the proposed circuit to generate the outputs of the simulated circuit. Such logic simulators are limited, however, in that they do not provide for use of a behavioral model which characterizes the circuit and thus do not allow the simulation input vectors for testing the circuit design to be automatically extracted from the circuit schematic diagram. Instead, the design engineer has had to painstakingly design and implement the simulation model and to create the input vector file.

An example of a logic simulator of the type described above is shown in FIG. 1. As shown, a simulation model 100 of the circuit being tested is provided to a logic simulator, such as a switch-level logic simulator 102, which simulates the functions of the circuit represented by the simulation model 100. Switch-level logic simulator 102 may include node evaluation algorithms which make it possible for the logic simulator 102 to simulate operation of circuits modeled entirely with bidirectional switches. Switch-level logic simulators are thus important tools for circuit design, for whenever a design engineer stops using classic logic gates and starts using dynamic or transfer gate logic, a switch-level logic simulator becomes necessary. This is because a conventional logic simulator cannot model all of the complex interactions which take place between non-classical transistor connections. Accordingly, the description herein is directed towards a system including a switch-level logic simulator.

The simulation model 100 of the circuit must be generated by the design engineer before a simulation can take place. This means that all of the elements, interconnections and nodes for a circuit design must be gathered together and converted into an input data file which is in a format acceptable to the logic simulator 102. Typically, the input data file contains a file having one entry for every transistor in the design, where the file is described using node numbers only, and also includes a file containing the node number to signal name mapping. The model is generated by converting the input files into a binary database which can be loaded directly into the logic simulator 102. In other words, the logic simulator 102 reads the input data file and formats it into a memory based data structure that expresses the connectivity of the circuit model. This data structure is then stored as a file in the logic simulator 102 and is referred to as the logic simulator database.

In addition to the simulation model 100, it is necessary to generate an input vector file 104 of input stimuli so that operation of the circuit can be simulated. The input vector file 104 contains all of the desired input stimulus patterns (vectors) and logic simulator control commands. The input vector file 104 may also contain any output assertions that predict the desired behavior of the circuit. The inclusion of the output assertions in an input vector file 104 allows the input vector set to act as a regression test and greatly simplifies post-processing of a simulation run. In addition to input stimuli, known faults may be inserted into the input vector file 104 so that the logic simulator 102 may be used as a fault simulator.

When the logic simulator 102 is run, two output files are typically created. The first file is the simulator list file, while the second is the raw data file. The simulator list file is typically an ASCII file which lists any simulator generated status messages as well as any assertion failures. The raw data file, on the other hand, is typically a non-ASCII file which contains the node transitions for every node in the logic simulator model for all of the time steps in the simulation. The raw data files are used by the logic simulator post-processor to display any requested node for any time period. In particular, the post-processor translates the raw data file into a form which is viewable by the user. The user can preferably control which signals and which time steps are displayed.

In addition, the logic simulator 102 may include a file which contains the values of all the nodes at a particular point in time. This file can be used to reset a simulation to a known state and is commonly used when developing an input vector file to save a state of the simulation model, such as a reset state, which can be restored over and over throughout a simulation. The ability to restart at a known point makes the process of developing an input vector file 104 easier.

As part of the test vector creation and simulation techniques described above, design engineers wrote detailed behavioral descriptions of both the circuit and the outside world as test and circuit specific vectors. Previous simulation methodologies provided two methods of creating such circuit specific vectors. In the first method, the input vector file 104 is created by the design engineer by hand by specifying the input vectors necessary to excite the circuit in accordance with the truth table. In other words, the design engineer has had to specify the portions of the truth table of the circuit which was to be tested by a particular simulation and has had to prepare the necessary input file 104 taking into account the capacitances of the circuit, propagation delays and the like so that the simulation would perform correctly. This process requires trial and error on the part of the design engineer and requires the design engineer to assume the proper simulation output response for each input stimulus. In accordance with this method, vector creation is tedious, time-consuming and inflexible for the design engineer and makes simulation of complicated dependent systems difficult. On the other hand, the second method handles complicated dependent systems by modeling them with a high level behavioral language. This method removes the designer from the actual vectors, assumes the function of the circuit can be predicted and involves modeling the entire system including the circuit itself. However, this method takes a great deal of time to develop and debug since the input vectors must be checked by hand in accordance with the output assertions.

Accordingly, it is desired that the best of these two methodologies be combined so that an interactive simulation environment can be created which allows for simple functional models (or state machines) to interrogate the simulated circuit at each evaluation point based on predefined rules and to interactively stimulate the simulated circuit as necessary. The present invention has been designed to meet these needs by providing the flexibility of a rule based system at the simulator level.

SUMMARY OF THE INVENTION

The above-mentioned problems in the prior art have been overcome in accordance with the present invention by developing a simple simulation methodology which acts interactively with the logic simulator and in the end allows the circuit description to model the circuit while letting higher level language models represent the other parts of the system. This is accomplished in accordance with the present invention by using a sockets interface such as a ARPA/ Berkeley UNTX® sockets interface to establish a communications socket between the logic simulator and a system for developing input stimuli based upon the state of the logic simulator. In other words, rather than predicting the response of the circuit being simulated and generating the input stimuli from the predicted response of the simulated circuit, the present invention allows the input stimuli to be determined directly from the actual state of the logic simulator. By so providing a communications socket and a real-time decision making capability based upon the output of the logic simulator, a functional simulation language for simulation in which the circuit description models the circuit and state machines model the world external to the circuit has been made possible in accordance with the invention. The present invention thus makes integrated circuit design and testing using CAD systems substantially easier for design engineers.

The system of the invention verifies the logical function of a circuit being designed by providing a communications interface from the logic simulator to a state based system which can model the external world, that is, the world external to the simulated circuit. Such a system in accordance with the present invention comprises a logic simulator (preferably a switch-level logic simulator), adaptive means for determining input vectors to the logic simulator and means for providing bidirectional communication between the logic simulator and the adaptive means. Generally, the logic simulator of the invention is responsive to input stimuli so as to perform a logic simulation which gives the logic values of nodes of the circuit being simulated in response to the Input stimuli. These input stimuli are provided by the adaptive means, which determines (based on simulated logic values of nodes of the simulated circuit as received from the logic simulator) input vectors representing the next input stimuli to the logic simulator for setting logic values of the nodes of the simulated circuit. The bidirectional communication means, on the other hand, provides bidirectional communication between the logic simulator and the adaptive means so as to provide current input stimuli to the logic simulator for a simulation and to provide the simulated logic values of the nodes of the simulated circuit to the adaptive means for use thereby in determining input vectors representing the next input stimuli.

Preferably, such a system in accordance with the invention comprises means for providing a program to the adaptive means, where the program includes state based equations which are processed by the adaptive means to determine input vectors representing the next input stimuli from the simulated logic values of the nodes of the simulated circuit resulting from application of the current input stimuli to the simulated circuit. For this purpose, the adaptive means preferably includes processing means for performing the steps of:

determining the next action requested by the program;

reading from the bidirectional communication means the current state of the logic simulator;

calculating the input vectors representing the next input stimuli from the current state of the logic simulator;

applying the input vectors representing the next input stimuli to the logic simulator via the bidirectional communication means;

advancing the logic simulator to its next state;

reading from the bidirectional communication means the simulated logic values of the nodes of the simulated circuit;

determining if the read simulated logic values of the nodes of the simulated circuit are correct; and providing an indication to a user of the logic simulator whether the simulated logic values are correct.

On the other hand, the adaptive means could itself comprise a program including state based equations unique to the simulated circuit which are processed by the adaptive means to determine input vectors representing the next input stimuli from the simulated logic values of the nodes of the simulated circuit resulting from application of the current input stimuli to the simulated circuit. In such a case, the program could be hard-coded into a processor of the adaptive means.

Accordingly, the system of the invention provides an automated method of verifying the logical function of a simulated circuit using a logic simulator which is responsive to input stimuli to perform a logic simulation which gives the logic values of nodes of the simulated circuit. Such a method is characterized in that it includes the steps of reading the current state of the logic simulator and calculating the input vectors representing the next input stimuli from the current state of the logic simulator. Such state-based calculation of the input stimuli has not heretofore been possible. Such a method in accordance with the invention is further characterized by the steps of:

applying the input vectors representing the next input stimuli to the logic simulator;

advancing the logic simulator to its next state;

reading the simulated logic values of the nodes of the simulated circuit for the next state of the logic simulator;

determining if the read simulated logic values of the nodes of the simulated circuit are correct; and providing an indication to a user of the logic simulator whether the simulated logic values are correct.

Accordingly, in accordance with the invention the logic simulator itself may be controlled through logic simulator directives included in an input vector file. Input stimuli can also be generated using high-level programming languages, thereby greatly simplifying the circuit design and testing process using CAD systems.

BRIEF DESCRIPTION OF THE DRAWINGS

These and other objects and advantages of the invention will become more apparent and more readily appreciated from the following detailed description of the presently preferred exemplary embodiment of the invention taken in conjunction with the accompanying drawings, of which:

FIG. 6(a) illustrates a prior art technique for simulating the operation of the circuit of FIG. 5(a), wherein the user must create a data file of all inputs and anticipated outputs.

FIG. 6(b) illustrates the technique of the invention whereby input stimuli to the logic simulator may be determined from state based equations and the logic simulator's response to current input stimuli.

DETAILED DESCRIPTION OF THE PRESENTLY PREFERRED EMBODIMENT

A system and method which affords the above-mentioned and other beneficial features in accordance with a presently preferred exemplary embodiment of the invention will be described below with reference to FIGS. 2–6. Those skilled in the art will readily appreciate that the description given herein with respect to those figures is for explanatory purposes only and is not intended in any way to limit the scope of the invention. All questions regarding the scope of the Invention may be resolved by referring to the appended claims.

The present invention differs from prior art logic simulation systems in that an input stimulus may be applied interactively to the logic simulator from a keyboard, from a data file, or from a UNIX® socket. As known to those skilled in the art, a ARPA/Berkeley UNIX® socket is a communication pathway which is established from one UNIX® process to another UNIX® process. The two UNIX® processes can either be on the same machine or be on different machines on the same network. The benefit of running the logic simulator of the present invention from such a socket is that the logic simulator can now take stimuli from an Adaptive Vector Generator (AVG) which can behaviorally model the more complex logic system that the logic simulator model is part of. As will be described below, the AVG can determine the next input vector based on the present state of the logic simulator model by first asking the logic simulator the value of specific nodes at the present point in time. Based on the results returned by the logic simulator, the AVG may then calculate the next stimulus pattern for the simulated circuit. Such a scheme greatly simplifies the input vector generation process and significantly increases the quality of the input vectors generated for testing of the circuit design. A preferred embodiment of such a system in accordance with the present invention will now be described with respect to FIG. 2.

Figure 1:
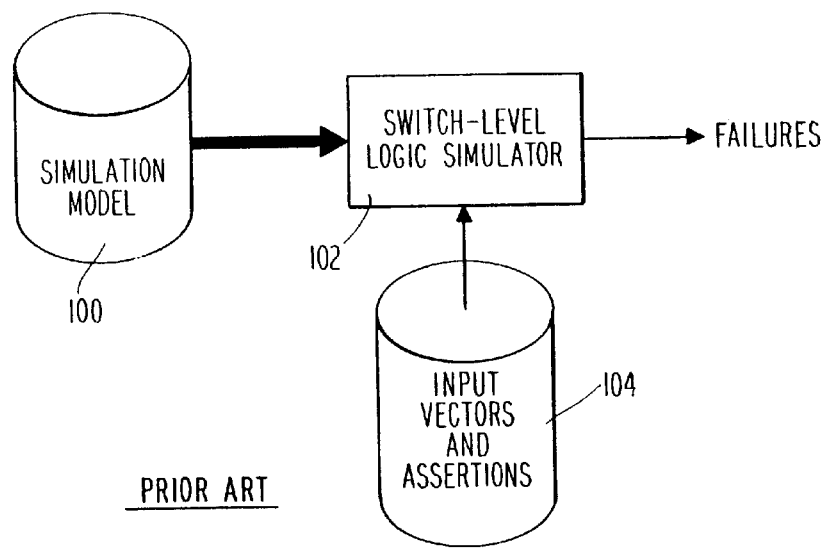
FIG. 1 illustrates a prior art logic simulation system wherein the input vectors and output assertions for modeling the system external to the simulated circuit are provided in a data file.
Figure 2:
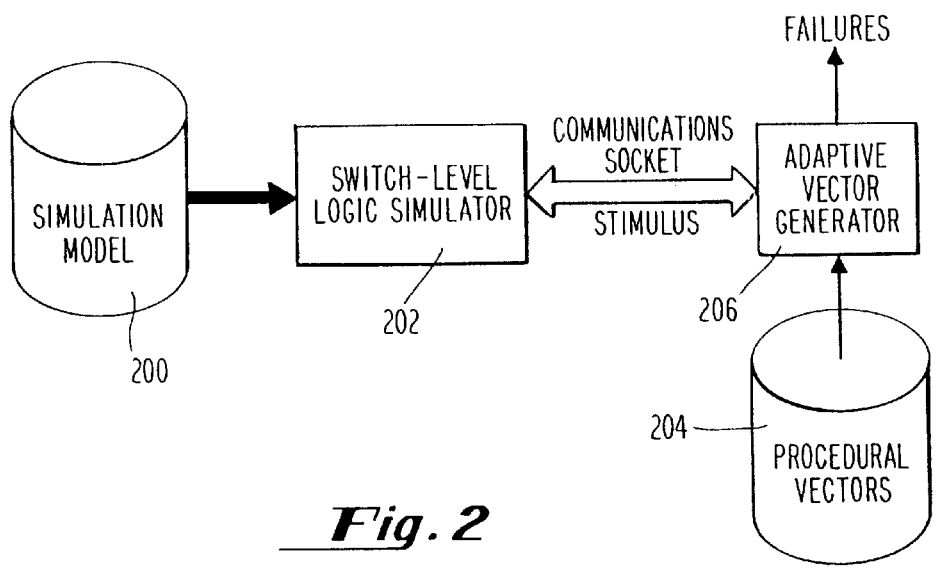
FIG. 2 illustrates a logic simulation system for verifying the logical function of a circuit in accordance with the techniques of the invention.

As shown in FIG. 2, the logic simulator system of the invention also includes a simulation model 200 which is provided to a switch-level logic simulator 202 as in the prior art. However, in accordance with the techniques of the invention, a communications socket is provided for inputting stimuli to the switch-level logic simulator 202 and for providing the stimulated outputs to a processing system. Such a processing system preferably includes AVG 206 which processes procedural vectors 204 to provide the input stimuli as will be described below. The communications socket is preferably a ARPA/Berkeley UNIX® socket which provides the input stimuli to the logic stimulator 202 from AVG 206 for a simulation and provides the simulated logic values of the nodes of the simulated circuit to AVG 206 for use thereby in determining input vectors representing the next input stimuli.

As will be apparent from the following description, the procedural vectors 204 need not be simple data file entries and can instead comprise processes or programs which allow the flexibility of high-level programming languages such as "C" and "Pascal" for modeling the environment external to the circuit being simulated. These procedural vectors 204 are thus used by AVG 206 to meet the application specific needs of the simulated circuit such that the next input stimuli to the simulated circuit is based on the present simulation state of the simulated circuit. Unlike prior art techniques, the next simulation state need not be known to develop the input stimuli. This allows the design engineer tremendous flexibility in determining the test input vector sets most useful in simulating the function of the circuit being designed. Moreover, any failures in the simulation model can be readily flagged by AVG 206 and indicated to the design engineer without automatically stopping the simulation.

As noted in the background portion of the specification, switch-level logic simulator 202 allows a circuit to be modeled entirely with bidirectional switches connecting nodes. In a preferred embodiment, the input nodes of the simulated circuit are represented as an ordered pair of state and strength. For example, the state of a node may be either 0,1 or X (don't care), while the strength of a node may be represented as an integer number. However, since switch-level logic simulators 202 are known to those skilled in the art, a description of a particular switch-level logic simulator 202 will not be given here. Rather, as will be apparent to one of ordinary skill in the art, the importance of the present invention can be found in that the input stimuli for the switch-level logic simulator 202 may be automatically determined from the previous state of the logic simulator, independent of the type of logic simulator. The communications protocol may, of course, be different for communication with different logic simulators. The benefits of such a system will be apparent from the following description of FIGS. 3 and 4.

Figure 3:
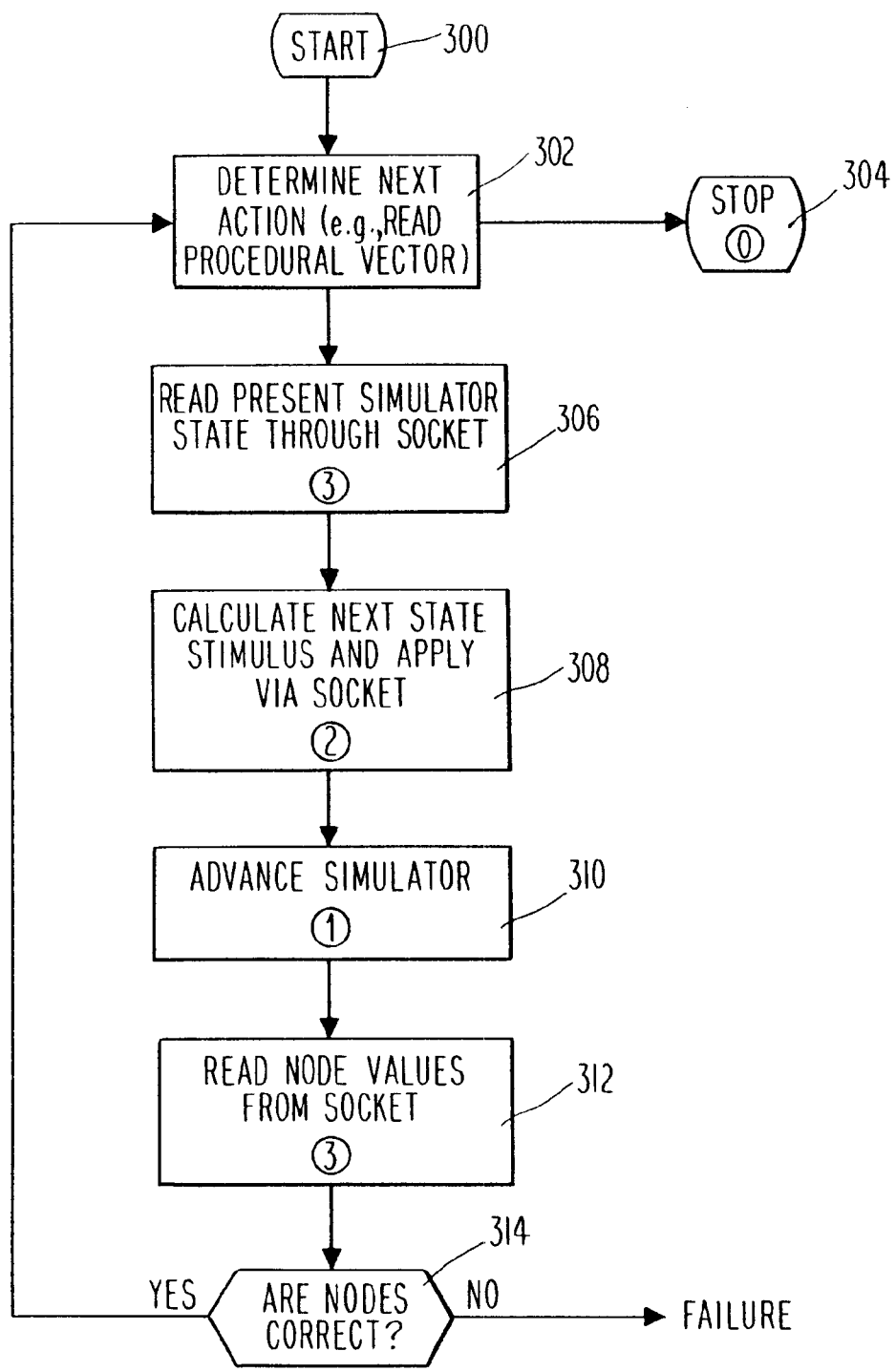
FIG. 3 is a flow diagram of a preferred embodiment of the adaptive vector generator of the invention of FIG. 2.

FIG. 3 illustrates a preferred embodiment of a process for performing the function of the adaptive vector generator 206. As will be apparent to one of ordinary skill in the art, the process of FIG. 3 may be hard-coded into AVG 206 or provided as part of the procedural vectors 204 and read into AVG 206 for processing. An example of a hard-coded system for providing the input stimuli and the truth tables of known and unknown circuits is described by Paul Nuber in a related U.S. patent application Ser. No. 07/683,949 entitled "A System For Automatically Determining The Logical Function Of A Circuit," which is filed on even date herewith by the present assignee and hereby incorporated by reference. For purposes of this description, the process of FIG. 3 may be read in or hard-coded. Preferably, the procedural vectors 204 are provided as a library for use by the operator of the logic simulator 202.

As shown in FIG. 3, AVG 206 starts at step 300 and determines the next action which is to be performed in the simulation process (step 302). For example, step 302 may include the step of processing the procedural vector corresponding to the next line of an input program which is specific to the circuit being simulated. If the next instruction (procedural vector) is a stop instruction indicating that the simulation is to stop, the process ends at step 304. Otherwise, the action specified by the procedural vector read in step 302 is performed by first reading the present logic simulator state through the communications socket (step 306) and then calculating the input stimuli for the next logic simulator state and applying it to the logic simulator 202 via the communications socket at step 308. The input stimuli for the next state are calculated by AVG 206 by updating the current state of the logic simulator 202 in accordance with the modeled logical function of the circuit set forth by the procedural vectors 204 (which may set forth the function of the circuit using high-level computer language instructions). The logic simulator 202 is then advanced in time at step 310 to advance the states of the simulated circuit in accordance with the new input stimuli, and the updated logic simulator states are read from the communications socket at step 312. If the node and/or output values of the logic simulator 202 are determined at step 314 to be those expected from the circuit design model, control returns to step 302 and the next procedural vector 204 is read. Otherwise, a failure signal is indicated to the user.

Figure 4:
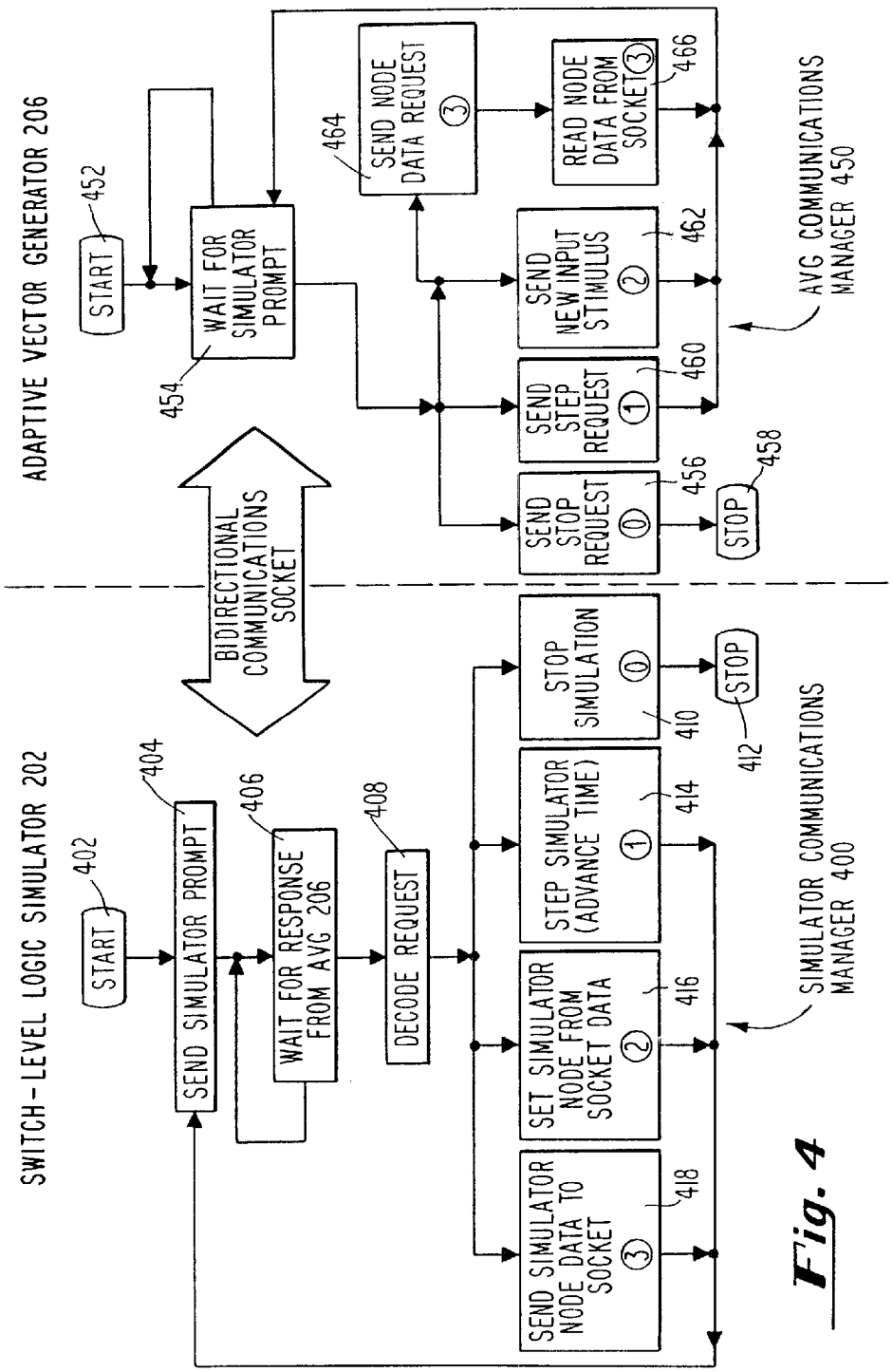
FIG. 4 illustrates the respective flow diagrams of the communications managers for the logic simulator and the adaptive vector generator of the invention of FIG. 2.

The process of FIG. 3 includes several communications between the switch-level logic simulator 202 and AVG 206. As shown in FIG. 4, a preferred embodiment of the communications protocol may be implemented by respective interfaces built into the switch-level logic simulator 202 and AVG 206. The switch-level logic simulator 202 comprises a simulator communications manager 400 which establishes a socket connection to remote processes and manages socket connections. The socket connections may then be used to provide bidirectional flow of data in accordance with the process described above with respect to FIG. 3. The AVG 206, on the other hand, comprises AVG communications manager 450, which functions by listening for socket requests, connecting AVG 206 to the logic simulator 202 when a socket request is received, and disconnecting communications when the simulation is complete. As will be described below, the communications managers 400 and 450 operate concurrently and cooperate to perform steps 306 through 312 of the process of FIG. 3, where correspondence between the steps of FIG. 3 and the steps of FIG. 4 may be found by comparing the encircled step numbers in FIG. 3 with the corresponding encircled step numbers in FIG. 4.

As shown in FIG. 4, the simulator communications manager 400 of the switch-level logic simulator 202 starts at step 402 and sends a simulator prompt at step 404 via the bidirectional communications socket to AVG 206 when a simulation process is to be initiated. The simulator communications manager 400 then waits for a response from the AVG communications manager 450 (step 406), and when a response is received, the response is decoded at step 408. If the response from the AVG communications manager 450 is a request that the simulation be stopped, the simulation is stopped at step 410 and the socket connection Is closed at step 412. On the other hand, if the response from the AVG communications manager 450 is a "step simulator" instruction requesting that the time of the switch-level logic simulator 202 be incremented by one time unit, the logic simulator 202 is advanced at step 414. If the response from the AVG communications manager 450 is input stimuli for the logic simulator 202, the nodes of the logic simulator 202 are set at step 416 by these input stimuli. Finally, if the response from the AVG communications manager 450 is a "send node data" request, the logic simulator node data is sent via the bidirectional communications socket to AVG 206 at step 418. Once one of steps 414, 416 or 418 has been completed, a simulator prompt is again sent to AVG 206 at step 404 via the bidirectional communications socket.

As noted above, the AVG communications manager 450 runs concurrently with the simulator communications manager 400 so as to complete the communications process via the bidirectional communications socket. In particular, the AVG communications manager 450 starts at step 452 and waits for a simulator prompt from simulator communications manager 400. Upon receipt of the simulator prompt at step 454, AVG 206 determines the next action to be taken by reading the next procedural vector 204 and acting accordingly. In particular, if the next procedural vector indicates that the simulation is to stop, a stop request is sent at step 456 and the AVG communications manager 450 process ends at step 458. However, if the next procedural vector is a "step simulator" instruction, a step request is sent at step 460 to the switch-level logic simulator 202 via the bidirectional communications socket. On the other hand, if the next procedural vector requests that the new input stimuli which have been calculated by AVG 206 be sent to the switch-level logic simulator 202, this data is sent at step 462. Finally, if the next procedural vector requests node data from the switch-level logic simulator 202, a request for node data is sent at step 464, and once such data is output to the communications socket, it is read from the communications socket by AVG communications manager 450 at step 466. At the conclusion of one of steps 460–466, control returns to step 454 where the process waits for the next simulator prompt from simulator communications manager 400.

The communications protocol of the Simulator communications manager 400 and the AVG communications manager 450 allows behavioral language specifying the function of the circuit being designed to be used to implement state based equations on the output of the logic simulator 202. For example, a procedural vector program can be written in a high-level computer language such as "C" or "Pascal" specifying the desired function of the circuit and provided to AVG 206 for processing. During processing, if AVG 206 instructs the logic simulator 202 to advance a state, a step request is sent at step 460, the simulator communications manager 400 decodes the simulator step request at step 408 and then steps logic simulator 202 at step 414. A simulator prompt is then returned to the AVG communications manager 450 to indicate to the AVG communications manager 450 at step 404 that the next procedural vector may be read. Then, if the next procedural vector is a request for the updated logic simulator state, a node data request is sent at step 464, decoded at step 408, and the requested data sent from the switch-level logic simulator 202 at step 418. This data is then read from the socket by AVG communications manager 450 at step 466. This communications process allows the logic simulator 202 to use "real time" decision making capabilities for simulation and to remove the tediousness of the prior art methods. Moreover, this communications process gives the system of the invention the power of determining the circuit inputs using high-level computer constructs. The benefits of this technique will now be shown by way of the simple example of FIGS. 5 and 6.

Figure 5A:
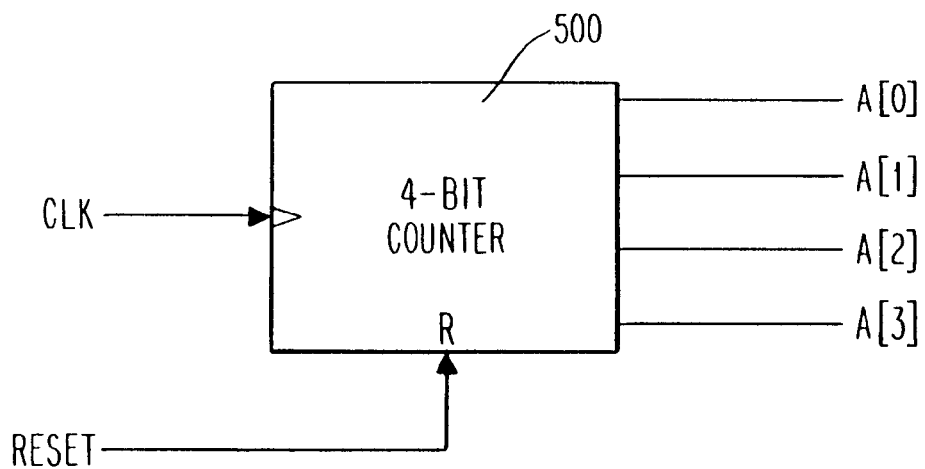
FIGS. 5(a) and 5(b) respectively illustrate a 4-bit counter and its anticipated output when simulated in accordance with the techniques of the invention.
Figure 5B:
Figure 5B:
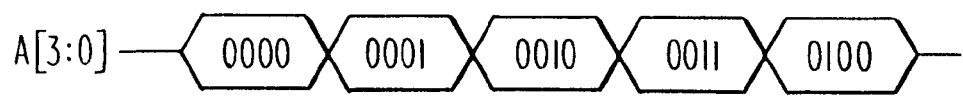

FIG. 5(a) illustrates a 4-bit counter 500 which is responsive to a clock signal CLK and a reset signal RESET to provide a 4-bit digital output A[0:3]. FIG. 5(b) illustrates a typical CLK signal and the anticipated 4-bit outputs.

FIG. 6(a) illustrates a prior art input vector file for input into a logic simulator for simulating the function of the 4-bit counter 500. As shown, the logic simulator is instructed to reset the 4-bit counter 500 and then to provide alternating clock signals having logic levels of 0 and 1. The logic simulator is incremented in time after each input CLK or RESET signal. The anticipated output values A[3:0] (or assertions) are then tested against the actual values produced by the logic simulator. As can be appreciated from FIG. 6(a), input stimuli must be provided manually for every logic state of the counter from (0000) to (1111) so that the output at each logic simulator stage can be verified as correct. Those skilled in the art will appreciate that this process becomes quite cumbersome for circuits more complicated than 4-bit counter 500.

FIG. 6(b) illustrates a sample procedural vector file 204 for determining the input vectors for logic simulator 202 in accordance with the techniques of the invention. As shown, loop equations may be implemented as procedural vectors within the input file 204 such that the next input stimuli to the logic simulator 202 may be based upon the current state X of the node data returned from the logic simulator 202. Also, as shown in the left margin of FIG. 6(b), processing of these procedural vectors 204 cause communications over the communications socket in accordance with those numbered steps 0–3 of FIGS. 3 and 4 described above. In particular, a procedural vector at line 10 requests that the node data X of the logic simulator 202 be read from the communications socket. When such a request is received, AVG communications manager 450 sends a node data request at step 464 which is then decoded at step 408 by the simulator communications manager 400 as described above and then processed at step 418. An input stimuli (CLK having a value of "1") is then sent by the AVG communications manager 450 over the bidirectional communications socket to the simulator communications manager 400 (step 462), decoded (step 408) and processed at step 416. The logic simulator 202 is then incremented by sending a step request at step 460 via the bidirectional communications socket, the step request is decoded at step 408 and the logic simulator advanced at step 414. A state based procedural vector may then be used to develop the input stimuli which will cause the logic simulator output state X to increment by 1 so as to perform the desired function of the 4-bit counter 500. This is accomplished by sending a node data request at step 464, reading the node data from the socket (step 466) and plugging these values into the equation "X+1". The clock state can then be advanced in the same manner as before. Finally, as shown by the last procedural vector in FIG. 6(b), the loop equation may be implemented by using conditional statements such as "IF" or "GOTO". Of course, other conditional statements which are possible in the chosen high-level computer language may also be implemented.

Thus, the present invention provides an interactive simulation environment which allows simple functional models (or state machines) to interrogate the circuit at each evaluation point and to interactively stimulate the circuit as necessary. Moreover, by using a communications socket to connect into the logic simulator, "real-time" decision making capabilities using ruled based models at the logic simulator level are possible. This is a significant improvement over the input vector file systems of the prior art wherein only unidirectional data flow was possible. Furthermore, by allowing the design engineer to interface the logic simulator to an adaptive vector generator which can model the circuit logic using a high-level behavioral language, the logic simulator may, for example, be simply instructed to receive a clock at a particular frequency rather than the design engineer having to tediously input the changes in logic level state and time delay necessary to specify a clock as input vectors. Also, the design engineer no longer has to keep track of the output states of the logic simulator and need no longer implement the circuit equation during provision of the input stimuli. As described above, this is possible because the user can use high-level programming languages such as "C" and "Pascal" for implementing the logic functions of the circuit being designed.

In sum, the present invention establishes a communications socket between the logic simulator and a vector generator program which basically expands the logic simulator feature set. Rudimentary decision making abilities using constructs such as IF and GOTO statements and higher hierarchical organization through macros may be implemented in accordance with the techniques of the invention and allows the input vector generator to react to the logic simulator output rather than to predict the logic simulator output. As a result, the input vector generator can initiate complex actions under given conditions. The user is thus given a rule based model at the logic simulator level which allows the design engineer to give the logic simulator a whole new dimension bordering on a high level functional simulation language.

Although the present invention has been described with respect to a particular embodiment, one skilled in the art will appreciate that the present invention may be modified without departing from the scope of the invention. For example, the communications socket could be used to link the logic simulator into a behavioral simulator to create a powerful mixed-mode simulation environment, which would allow the substitution of switch-level models for behavioral models when they are designed. This allows for the simulation of a system at the behavioral level with switch-level models used for some of the circuit elements. Also, although the invention has been described for use with UNIX® sockets, any other means for providing interprocess communication, such as shared memory, may be used as well. Accordingly, all such modifications are intended to be included within the scope of the invention as defined by the following claims.

I claim:

1. A bidirectional communications stimulus interface for a logic simulator, said logic simulator being responsive to input stimuli for performing a logic simulation of a simulated circuit representing a simulator model of a circuit design and which gives logic values of respective nodes of the simulated circuit, said interface comprising:

adaptive means for processing procedural vectors, which model an environment external to the simulated circuit, in realtime using current simulated logic values of the respective nodes of the simulated circuit to determine next input stimuli for the logic simulator for setting logic values of the respective nodes of the simulated circuit; and bidirectional communication means operating between the logic simulator and the adaptive means for providing the next input stimuli determined by the adaptive means to the logic simulator and for providing the current simulated logic values of the respective nodes of the simulated circuit from the logic simulator to the adaptive means for use thereby in determining the next input stimuli.

2. The interface of claim 1, further comprising means for providing a program to the adaptive means, said program including the procedural vectors which are processed in realtime by the adaptive means to determine the next input stimuli using the current simulated logic values of the respective nodes of the simulated circuit.

3. The interface of claim 2, wherein said adaptive means includes processing means for performing in realtime the steps of:

determining a next action requested by said program;

reading from the bidirectional communication means the current simulated logic values of the respective nodes of the simulated circuit from the logic simulator;

calculating the next input stimuli using the procedural vectors and based on the current simulated logic values of the respective nodes of the simulated circuit;

applying the next input stimuli to the logic simulator via the bidirectional communication means;

advancing the logic simulator to a next state;

reading from the logic simulator via the bidirectional communication means advanced simulated logic values of the respective nodes of the simulated circuit;

determining if the advanced simulated logic values of the respective nodes of the simulated circuit are correct; and providing an indication to a user of the logic simulator whether the advanced simulated logic values are correct.

4. The interface of claim 1, wherein the adaptive means comprises a program including the procedural vectors, said procedural vectors being unique to the simulated circuit and being processed in realtime by the adaptive means to determine the next input stimuli using the current simulated logic values of the respective nodes of the simulated circuit.

5. The interface of claim 1, wherein said logic simulator is a switch-level logic simulator.

6. A system for testing a logical function of a circuit design, comprising:

a logic simulator responsive to input stimuli for performing a logic simulation of a simulated circuit, said simulated circuit representing a simulator model of the circuit design, which gives current simulated logic values of respective nodes of the simulated circuit in response to the input stimuli;

adaptive means for processing procedural vectors, which model an environment external to the simulated circuit, in realtime using the current simulated logic values of the respective nodes of the simulated circuit to determine next input stimuli for the logic simulator for setting logic values of the respective nodes of the simulated circuit; and bidirectional communication means operating between the logic simulator and the adaptive means for providing the next input stimuli determined by the adaptive means to the logic simulator and for providing the current simulated logic values of the respective nodes of the simulated circuit from the logic simulator to the adaptive means for use thereby in determining the next input stimuli.

7. The system of claim 6, further comprising means for providing a program to the adaptive means, said program including the procedural vectors which are processed in realtime by the adaptive means to determine the next input stimuli using the current simulated logic values of the respective nodes of the simulated circuit.

8. The system of claim 7, wherein said adaptive means includes processing means for performing in realtime the steps of:

determining a next action requested by said program;

reading from the bidirectional communication means the current simulated logic values of the respective nodes of the simulated circuit from the logic simulator;

calculating the next input stimuli using the procedural vectors and based on the current simulated logic values of the respective nodes of the simulated circuit;

applying the next input stimuli to the logic simulator via the bidirectional communication means;

advancing the logic simulator to a next state;

reading from the logic simulator via the bidirectional communication means advanced simulated logic values of the respective nodes of the simulated circuit;

determining if the advanced simulated logic values of the respective nodes of the simulated circuit are correct; and providing an indication to a user of the logic simulator whether the advanced simulated logic values are correct.

9. The system of claim 6, wherein the adaptive means comprises a program including the procedural vectors, said procedural vectors being unique to the simulated circuit and being processed in realtime by the adaptive means to determine the next input stimuli using the current simulated logic values of the respective nodes of the simulated circuit.

10. The system of claim 6, wherein said logic simulator is a switch-level logic simulator.

11. An automated method of testing a logical function of a circuit design in a logic simulator which is responsive to input stimuli for performing a logic simulation of a simulated circuit, said simulated circuit representing a simulator model of the circuit design, which gives logic values of respective nodes of the simulated circuit, the method comprising the steps of:

reading current simulated logic values of the respective nodes of the simulated circuit from the logic simulator, and calculating next input stimuli for the logic simulator using an adaptive means to process procedural vectors which model an environment external to the simulated circuit and based on the current simulated logic values of the respective nodes of the simulated circuit.

12. The method of claim 11, comprising the further steps of:

applying the next input stimuli to the logic simulator;

advancing the logic simulator to a next state;

reading advanced simulated logic values from the respective nodes of the simulated circuit;

determining if the advanced simulated logic values of the respective nodes of the simulated circuit are correct; and providing an indication to a user of the logic simulator whether the advanced simulated logic values are correct.

* * * * *